United States Patent
Burns et al.

(10) Patent No.: US 7,994,060 B2
(45) Date of Patent: Aug. 9, 2011

(54) DUAL EXPOSURE TRACK ONLY PITCH SPLIT PROCESS

(75) Inventors: Sean D. Burns, Hopewell Junction, NY (US); Matthew E. Colburn, Albany, NY (US); Steven J. Holmes, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/551,801

(22) Filed: Sep. 1, 2009

(65) Prior Publication Data

US 2011/0049680 A1 Mar. 3, 2011

(51) Int. Cl.
*H01L 21/311* (2006.01)
*H01L 21/469* (2006.01)

(52) U.S. Cl. ........ 438/694; 438/695; 438/703; 438/761; 257/E21.017; 257/E21.025; 257/E21.026; 257/E21.027

(58) Field of Classification Search ........... 257/E21.017, 257/E21.025, E21.026, E21.027
See application file for complete search history.

(56) References Cited

U.S. PATENT DOCUMENTS

| | | | | |
|---|---|---|---|---|
| 5,888,678 | A * | 3/1999 | Tzu et al. | 430/5 |
| 7,824,842 | B2 * | 11/2010 | Finders | 430/313 |
| 7,879,727 | B2 * | 2/2011 | Postnikov et al. | 438/700 |
| 2002/0150834 | A1 * | 10/2002 | Yamamoto et al. | 430/270.1 |
| 2008/0254633 | A1 * | 10/2008 | Burns et al. | 438/703 |
| 2009/0035668 | A1 * | 2/2009 | Breyta et al. | 430/18 |
| 2009/0081563 | A1 * | 3/2009 | Wang et al. | 430/5 |
| 2009/0104566 | A1 * | 4/2009 | Burkhardt et al. | 430/315 |
| 2009/0208865 | A1 * | 8/2009 | Brunner et al. | 430/270.1 |
| 2009/0246958 | A1 * | 10/2009 | Burns et al. | 438/694 |

* cited by examiner

*Primary Examiner* — Charles D Garber
*Assistant Examiner* — Mohsen Ahmadi
(74) *Attorney, Agent, or Firm* — Whitham, Curtis, Christofferson & Cook, P.C.

(57) ABSTRACT

An integrated circuit is formed with structures spaced more closely together than a transverse dimension of such structures, such as for making contacts to electronic elements formed at minimum lithographically resolvable dimensions by dark field split pitch techniques. Acceptable overlay accuracy and process efficiency and throughput for the split pitch process that requires etching of a hard mark for each of a plurality of sequentially applied and patterned resist layers is supported by performing the etching of the hard mask entirely within a lithography track through using an acid sensitive hard mark material and an acidic overcoat which contacts areas of the hard mask through patterned apertures in the resist. The contacted areas of the hard mask are activated for development by baking of the acidic overcoat.

15 Claims, 3 Drawing Sheets

DUAL EXPOSURE TRACK ONLY PITCH SPLIT PROCESS

FIELD OF THE INVENTION

The present invention generally relates to the manufacture of high integration density integrated circuits and, more particularly, simplification of pitch split processes for lithographically forming discrete features in close proximity to each other.

BACKGROUND OF THE INVENTION

The quest for higher performance, increased functionality and lower cost of digital switching circuits has led to high integration density of integrated circuits where more circuit elements are formed at smaller sizes and in greater proximity so that more such elements can be included on a chip of a given size for increased functionality while increasing the number of circuit elements formed by a given sequence of processes and interconnected with shorter connections of reduced capacitance for faster signal propagation and reduced susceptibility to noise. It follows that integrated circuits having the highest performance currently available will also be designed at the limit of the ability to lithographically form features of circuit elements and interconnections with acceptable manufacturing yield. Therefore scaling to smaller sizes is limited by the ability to achieve shorter wavelength or higher numerical aperture exposure systems.

The properties of radiation (e.g. visible light, ultraviolet light, x-rays, etc.) that can be used to expose a pattern on a lithographic resist and properties of lithographic resists cause some effects such as diffraction at mask aperture edges, reflection and scattering of radiation in the resist and, since resist exposure is cumulative, tend to reduce fidelity of the exposed pattern to the exposure mask. These effects are collectively known as optical proximity effects which can sometimes be exploited to improve larger shapes but may unavoidably distort small, closely spaced features produced. In general, optical proximity effects can only be partially compensated.

While not admitted to be prior art in regard to the present invention, to avoid optical proximity effects to the extent possible, so-called pitch split processes have been developed which essentially divide the features to be produced between a plurality of lithographic masks to expose a like plurality of applications of lithographic resist to expose a layer of material on the chip known as a hard mask with the overlaid exposures and then use the in-situ hard mask to form the closely spaced features. Pitch split processes thus allow fewer and more separated features to be formed on each lithographic mask and thus provide possibly the best technique for avoiding or at least reducing optical proximity effects. However, pitch split processes are, by their nature, extremely critical in regard to positioning of the sequence of lithographic exposures and inaccuracy of positioning, known as overlay error must be held to very small distances, often within a few nanometers. Further, each exposure of the exposure sequence must be followed by an etching step, generally reactive ion etching (RIE), for transferring the resist pattern into the hard mask with yet another etching process (also generally RIE) to transfer the hard mask pattern into the desired layer or substrate. Accordingly, a pitch split process is often referred to as a double exposure, double etch process although the number of exposure and etch process can exceed two. The term multiprocess patterning is also used and is more accurately descriptive.

Etching processes are complex and critical (e.g. possibly requiring a sequence of etchants at critical concentrations and temperatures in reaction chambers that may be specific to particular etchants and etching conditions) with relatively small process windows and must be performed to provide especially consistent results in pitch split processes. Such additional complexity cannot be accommodated within the lithography track of current semiconductor manufacturing lines which are generally limited to applying, exposing and developing patterns in a resist. Multiprocess patterning thus requires substantial additional complexity and cost to perform in currently available facilities while the adaptation of manufacturing lines is not feasible due to cost and the different number of pitch split exposures that may be required for different device designs.

SUMMARY OF THE INVENTION

It is therefore an object of the present invention to provide a double exposure, track only (DETO) pitch split process which does not require reactive ion etching (RIE) for each pitch split mask/exposure to produce a hard mask having a desired pattern and thus can be performed entirely within the lithography track of current semiconductor manufacturing lines.

In order to accomplish these and other objects of the invention, a method is provided for etching a pattern in a layer of acid sensitive material for forming an integrated circuit comprising steps of forming a layer of acid sensitive hard mask material, forming and patterning a layer of resist on the layer of acid hard mask sensitive material, applying an acidic overcoat on the patterned layer of photoresist and areas of the acid sensitive material exposed by the photoresist, activating the areas of the acid sensitive material, and developing the activated areas of the acid sensitive material to transfer a pattern in the resist to the acid sensitive hard mask material and repeating them, as necessary, whereby a hard mask pattern is built up which could not otherwise be lithographically exposed for etching underlying material to result in an integrated circuit in accordance with the invention.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
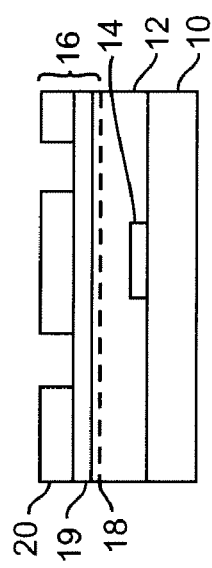
FIGS. 1A, 1B, 1C, 1D, 1E, 1F, 1G and 1H illustrate a sequence cross-sectional views of a generalized semiconductor structure produced by respective exposure and etching processes in accordance with a double exposure, double etch process over which the present invention provides an improvement.
Figure 1B:
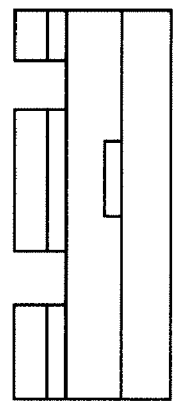
Figure 1C:
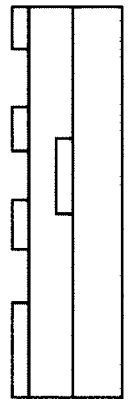

Referring now to the drawings, and more particularly to FIG. 1, there is shown a sequence of cross-sectional views of a generalized semiconductor structure produced by various resist exposure and etching processes of a double exposure, double etch process for reducing or avoiding optical proximity effects. While the invention provides an improvement over double exposure, double etch processes, such processes and the illustration of FIG. 1, in particular, are not admitted to be prior art in regard to the present invention. FIG. 1 is provided to facilitate an understanding of and appreciation for the present invention and therefore FIG. 1 is designated as "Related Art".

As alluded to above, semiconductor manufacturing lines are generally organized into groups of processes that are performed by apparatus which differs between groups of processes. The apparatus will generally require a set-up for a given set of processes and wafers will be stored between processes and all wafers requiring particular processing for which apparatus has been set up will be processed before another set-up is performed for another process. One such group of processes is referred to as a lithography track in which the processes are generally limited to the application of resist, various treatments of the resist such as drying or baking, exposure of the resist and development of the exposed resist to form a pattern. Generally, such processes form a pattern that establishes a location and basic dimensions of a device to be formed by processes which are preferably self-aligned with a structure created in accordance with the resist pattern or, at a later stage of the manufacturing process, to form vias or apertures to make electrical contacts to the otherwise completed device and wiring therebetween. Etching and material deposition processes which are much more complex and may have small process parameter windows are generally excluded from the lithography track. Since multi-process patterning requires an etch of the hard mask for each resist exposure, it can be readily understood that moving wafers between groups of processes with associated storage can greatly delay the completion of chips which require multiprocess patterning and potentially compromise critical overlay accuracy.

The generalized semiconductor structure includes a substrate or layer 10 (e.g. with other layers and a substrate below it which are not shown) and an organic underlayer 12, sometimes referred to as an organic planarizing layer (OPL) in which it is desired to make closely spaced openings. Additional structures 14 such as a transistor gate or conductor/connection may also be formed on substrate or layer 10 and extend into layer 12.

It should be appreciated that optical proximity effects generally involve some spreading of the exposed pattern by excess or aberrant exposure due to diffraction effects or effects of radiation reflecting or scattering in the resist. Therefore, extremely fine features that are smaller than the spacing between them are generally exposed and patterned by so-called bright field techniques and resists where the features are not illuminated such that spreading of exposed shapes tends to reduce the size the intended features. By the same token, optical proximity effects are generally more easily controlled and less severe using bright field techniques and resists. Conversely, features that are larger than the spacing between them, as is often the case for making contacts to devices such as transistors that have structures defined at the minimum lithographically resolvable dimensions, are best formed by illumination of the features using so-called dark field techniques and resists. The invention can be used with either bright field or dark field techniques but is particularly advantageous with dark field multiprocess patterning where optical proximity effects are particularly pronounced and difficult to manage.

In of FIG. 1A, a three layer resist stack 16 comprising an organic underlayer or OPL 18, a hard mask 19 and a thin (to reduce reflection and scattering within the resist and to reduce the likelihood of resist collapse that can occur if the resist layer is too thick) photoresist/immersion topcoat 20 has been applied and the photoresist has been patterned by exposure and development to open the photoresist 20 to hard mask anti-reflection coating (ARC) 19 such as silicon ARC or SiARC. (As used above and hereinafter, the term photoresist should be understood to be any material that can be patterned by a lithographic exposure and development, regardless of the type of energy (e.g. X-rays) or particles (e.g. electrons) used to make the exposure.) The pattern in the photoresist 20 is then transferred to the hard mask 19 and, in turn, to the OPL by conventional etching processes such as reactive ion etching (RIE), resulting in the structure shown in FIG. 1B. More specifically, the etch selectivity of the hard mask material relative to the OPL material is very high (e.g. 10-20); allowing the OPL 18 to be used as an etch stop followed by another RIE process using different reactants to etch the hard mask. The photoresist can then be stripped to result in the structure shown in FIG. 1C.

Figure 1D:
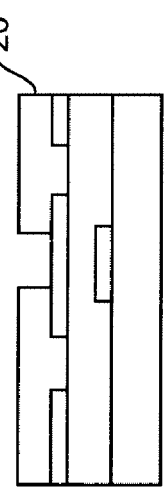
Figure 1E:
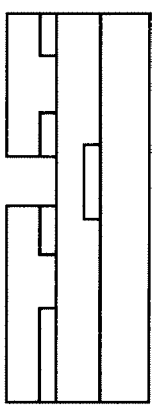
Figure 1F:
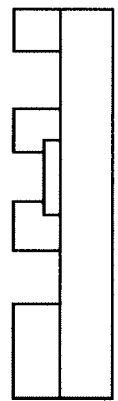
Figure 1G:
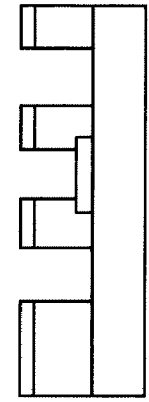
Figure 1H:
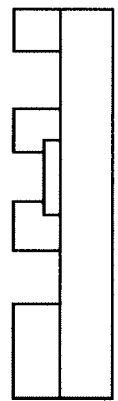

Then, to achieve pitch splitting as discussed above, a second photoresist layer 20' is applied over the patterned hard mask and also patterned by exposure and development, resulting in the structure shown in FIG. 1D, and conventional etching again performed, as described above, to transfer the photoresist pattern to the hard mask 19, as shown in FIG. 1E. The remaining photoresist is then stripped, leaving the hard mask as patterned by the second lithography mask (and the first lithography mask) with the organic underlayer 18 in place as shown in FIG. 1F. If desired or necessary due to the proximity of the openings in the hard mask pattern required for a given device design, one or more additional sequences of applying and patterning a photoresist over the patterned hard mask, etching of the hard mask and removal of the residual photoresist can be performed. At this point, some refinements of the hard mask pattern can be achieved by block-out masking, if needed in regard to less than all features formed in the hard mask, and adjustment of aperture size by additional etching to enlarge the features or by anisotropic deposition of material and isotropic etch to reduce feature size, much in the nature of forming sidewall spacers on other structures. Such refinement processes can also be performed on hard mask apertures prior to application and patterning of any of the sequence of further photoresists, with or without block-out masking; possibly allowing some block out masking processes to be omitted.

When the hard mask patterning is complete, suitable conventional etching is again performed to transfer the hard mask pattern thus achieved by the pitch split processing to the device layer 12 and shown in cross-section (g) and the hard mask optionally removed as shown in cross-section (h). It should be noted that since the hard mask 19 and OPL 18 are selectively etchable relative to each other and the hard mask pattern is actually composed of a hard mask ARC layer and the OPL layer which are similarly patterned, a wide variety of etchants and process parameters can be used for transferring the pattern to the underlying material and the etch may be freely designed as may be appropriate to that underlying material.

It should be noted that pitch splitting cannot be achieved, especially for very small and closely spaced features, simply by multiple exposures of a single photoresist layer since an edge of a lithographic exposure mask will produce some diffraction that will partially expose the photoresist in areas which do not correspond to patterns in the lithographic exposure mask. For very small and closely spaced features, the photoresist is generally formed to be very thin for reasons noted above; requiring less exposure while the proximity of intended features (and possibly so-called assist features which exploit diffraction to increase or decrease exposure of particular areas) virtually guarantees that diffraction patterns will overlap the intended patterns causing additional and often cumulative exposure; distorting the pattern that will be developed in the photoresist. Therefore, each lithographic exposure using a different pitch splitting lithographic mask must be followed by at least one etching process to transfer the pattern to the hard mask and a new photoresist layer applied over the patterned hard mask and patterned to incrementally develop the desired hard mask pattern. Possibly, additional etching processes may be required to adjust the hard mask pattern to enlarge or shrink pattern features as alluded to above. An additional etching process is required to transfer the hard mask pattern to device layer 12.

Thus it can be seen that while a pitch split process can reduce or avoid proximity effects, if conventional etching processes are employed, pitch split processes become very complex and multiply the number of etching processes required and consequent switching back and forth between the lithography track and reaction vessels for etching and storage until suitably set up reaction vessels are available, while individual etching processes may, themselves, involve substantial complexity. Such additional complexity cannot be accommodated within the lithography track of current designs of semiconductor manufacturing lines. Additional overall process complexity and some compromise of manufacturing yield is thus engendered by the need to perform such numerous etching processes outside the lithography track.

The invention provides a solution to this complexity by providing for such etching to be performed entirely within the lithography track by using an acid sensitive hard mask material such as siloxane or titanium oxide. Other suitable materials include titanium polymers and co-polymers of titanium, silicon, aluminum zirconium and hafnium as described in U.S. Pat. No. 6,303,270 to Flaim et al. which is hereby fully incorporated by reference. An acid overcoat is then applied over the acid sensitive hard mask material layer and developed resist pattern. Suitable acid overcoat materials are commercially available such as TCX041, NFC700 or NFC 445 which are available from JSR Micro, Inc., 1280 N. Mathilda Ave., Sunnyvale, Calif. 94089-1213. The acidic overcoat is preferably applied using a spin-on process to develop a uniform layer, baked at 100° C. to 150° C. for about 60 to 120 seconds or other temperature and time, depending on acid sensitive hard mask material and acidic overcoat materials, sufficient to activate the acid sensitive hard mask material to develop where the acidic overcoat contacts the acid sensitive hard mask material and then the overcoat is developed, preferably in aqueous tetramethyl ammonium hydroxide (TMAH) for 30 to 60 seconds to remove it and the acid sensitive hard mask material in the areas where the acid sensitive hard mask material has been activated. A suitable developer is 0.26 N TMAH but other concentrations (e.g. from 0.12 N TMAH to 0.4 N TMAH) may also be used. Therefore, the etching required for all of the hard mask patterning in the pitch split process can be performed by coating, baking and developing processes which are common to the lithography track of semiconductor manufacturing lines.

Figure 2C:
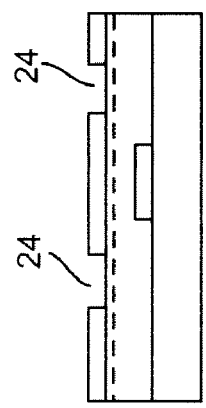
FIGS. 2A, 2B, 2C, 2D, 2E, 2F, 2G and 2H illustrate a sequence of cross-sectional views of a generalized semiconductor structure produced by respective exposure and etching processes in accordance with a double exposure, lithographic track only process in accordance with the invention.
Figure 2F:
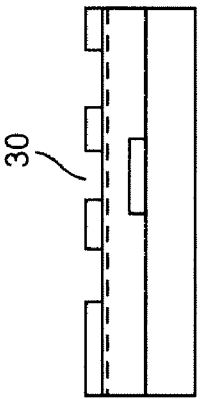
Figure 2B:
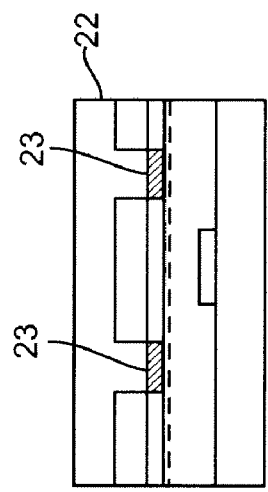
Figure 2E:
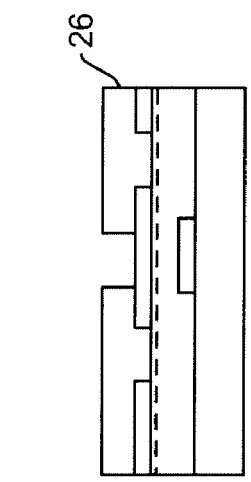
Figure 2H:
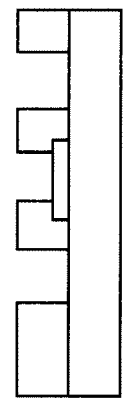
Figure 2A:
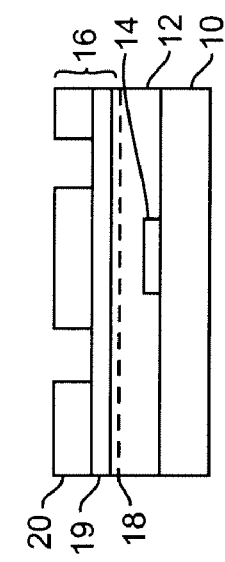

Specifically, and referring to FIGS. 2A-2H and FIG. 3, the pitch split process performed by the invention will now be discussed. FIG. 2A is identical to FIG. 1A where the three layer resist stack including an organic underlayer 18, a hard mask 19 of acid sensitive material such as siloxane or titanium oxide as alluded to above and photoresist 20 have been applied, exposed by a first pitch split lithographic mask and developed to form a pattern in resist layer 20 as depicted in steps 305, 306, 307, 308 and 310 of FIG. 3. Then, to perform etching of the acid sensitive hard mask material, acidic overcoat 22 of TCX041 or NFC700 is applied, preferably by a spin-on process at step 315 and baked at step 320, as described above, to activate regions 23 of the acid sensitive hard mask material contacted by the acidic overcoat through patterned apertures in the resist which are depicted by crosshatching in FIG. 2B. The assembly is then developed at step 325 in aqueous TMAH for 30 to 60 seconds to remove the overcoat 22 and etch away activated regions of the acid sensitive hard mask material, stopping on the organic underlayer 18 and leaving apertures 24 as depicted in cross-section (c) of FIG. 2 after stripping of the residual photoresist layer 20.

Figure 2D:
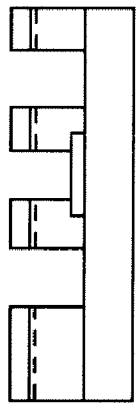
Figure 2G:
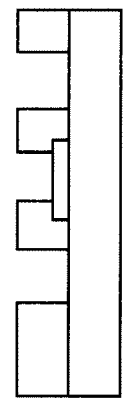
Figure 3:
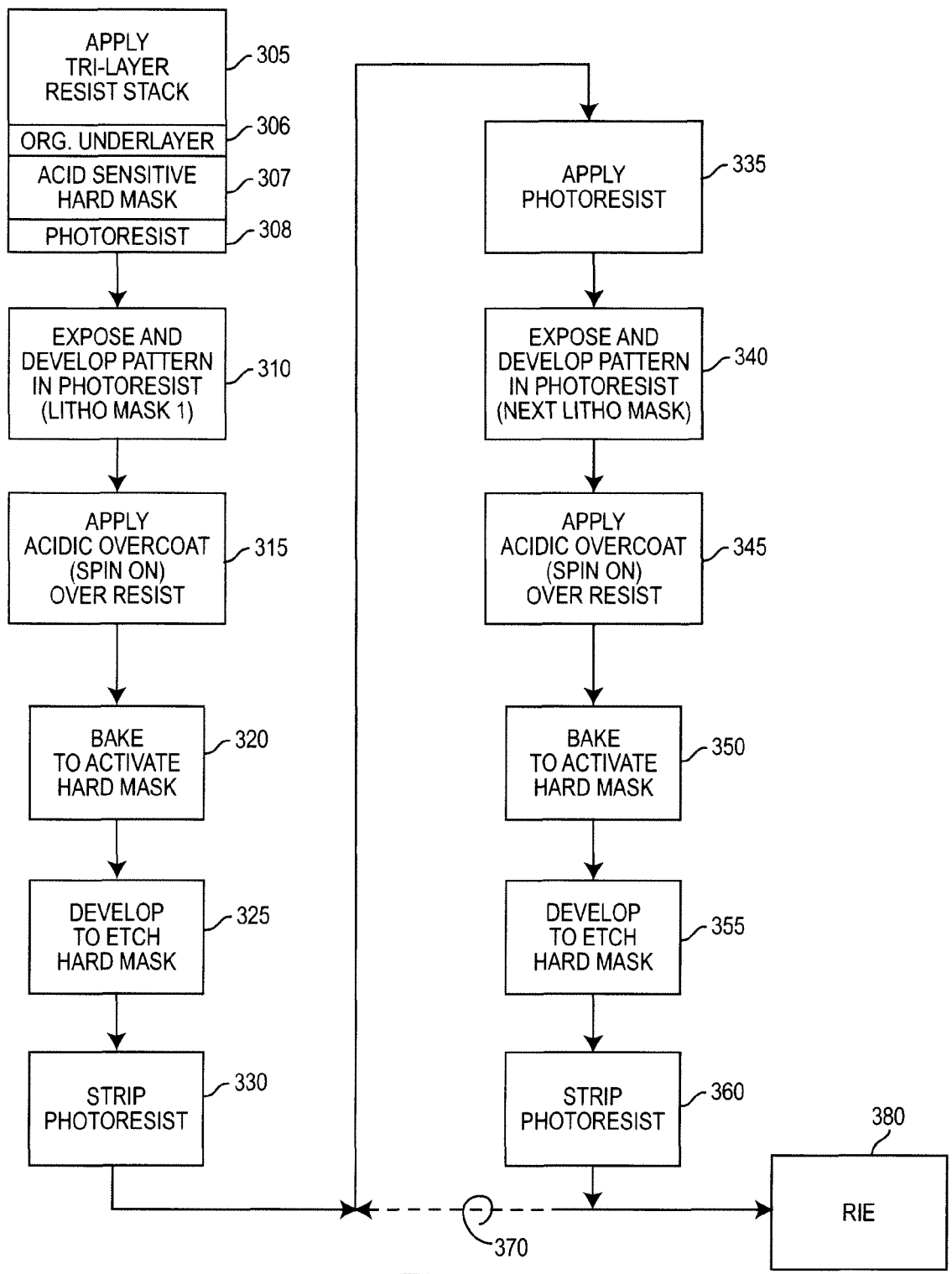
FIG. 3 is a flow chart illustrating the principal processes required for the practice of the invention.

The pitch split process in accordance with the invention continues with the application of another layer of photoresist layer 26 at step 335 as shown in FIG. 2D. It will be noted that the steps 335 through 360 are identical with steps 305 through 330 except that application of the organic underlayer and application of the acid sensitive hard mask material steps 306, 307 are omitted since those layers remain in place in areas not etched by the steps already performed. Accordingly the newly applied photoresist layer 26 is exposed and developed as before in step 340 and an acid overcoat 28 is applied (345) and baked (350) to activate the acid sensitive hard mask material in areas 25, also as before. The overcoat and activated region 25 of the acid sensitive hard mask material are then developed to etch away region 25 of the hard mask at step 355, again stopping on the organic underlayer 18 and residual photoresist is stripped. The organic underlayer 18 need not be and generally is not removed although some surface etching of the organic underlayer may occur during resist stripping.

If additional features are required that have not yet been formed in hard mask 19, the process loops as indicated by dashed line 370 and steps 335-360 repeated with yet another lithographic exposure mask as necessary until the desired hard mask pattern is completed. The hard mask pattern can then be transferred to layer 12 by conventional etching (e.g. RIE outside the lithography track in accordance with normal manufacturing line organization and operation) and the device completed in the normal manner as may be required for the semiconductor device design.

As alluded to above, additional processes may be performed to adjust or refine the patterns produced in the hard mask prior to performance of step 345 or its repetition. On the other hand, the pitch split process in accordance with the invention increases convenience of the etches such that more pitch split masks and exposures can be economically performed; potentially reducing the need for such adjustments/refinements of the pattern and, in any case the adjustments/refinements of the hard mask pattern can be performed outside the lithographic track as processes preliminary to etch process 380 or as an incident thereof.

Thus, it is seen that the basic principle of the invention is to perform etching of the hard mask as required by a pitch split process through use of particular hard mask materials that are acid sensitive and use of an acidic overcoat that can be performed entirely within the lithographic track of a conventional semiconductor manufacturing line. Performing etching in such a manner within the lithographic track provides for simplification and possibly automation of the many etching processes involved in pitch split processes employed to reduce or avoid optical proximity effects when fine features must be formed in extremely close proximity. The invention also avoids compromise of manufacturing yield by removal from and return to the lithographic track for each of the numerous etching processes and increases throughput of the manufacturing line over previous pitch split processes, as well.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for etching a pattern in a layer of acid sensitive material, said process comprising steps of
    forming said layer of acid sensitive material,
    forming and patterning a layer of resist on said layer of acid sensitive material,
    applying an acidic overcoat on said patterned layer of photoresist and areas of said acid sensitive material exposed by said photoresist,
    activating said areas of said acid sensitive material, and
    developing said activated areas of said acid sensitive material to transfer a pattern in the resist to said acid sensitive material.

2. The method as recited in claim 1 comprising the further steps of
    forming and patterning a further layer of resist on said layer of acid sensitive material,
    applying an acidic overcoat on said patterned layer of photoresist and areas of said acid sensitive material exposed by said photoresist,
    activating said areas of said acid sensitive material, and
    developing said activated areas of said acid sensitive material to transfer a pattern in the resist to said acid sensitive material.

3. The method as recited in claim 2, comprising the further step of
    transferring a pattern developed in said acid sensitive material to an underlying layer of material.

4. The method as recited in claim 2, wherein said acid sensitive material is formed on an organic planarizing layer.

5. The method as recited in claim 2, further including a step of
    adjusting size of a feature patterned in said resist.

6. The method as recited in claim 2, further including a step of
    adjusting size of a feature patterned in said acid sensitive material.

7. The method as recited in claim 1, comprising the further step of
    transferring a pattern developed in said acid sensitive material to an underlying layer of material.

8. The method as recited in claim 1, wherein said acid sensitive material is formed on an organic planarizing layer.

9. The method as recited in claim 1, further including a step of
    adjusting size of a feature patterned in said resist.

10. The method as recited in claim 1, further including a step of
    adjusting size of a feature patterned in said acid sensitive material.

11. A pitch split process for semiconductor manufacturing, said process comprising steps of
    forming a layer of acid sensitive material,
    forming and patterning a layer of photoresist on said layer of acid sensitive material using a lithographic pitch split exposure mask,
    applying an acidic overcoat on said patterned layer of photoresist and areas of said acid sensitive material exposed by said photoresist,
    activating said areas of said acid sensitive material, and
    developing activated areas of said acid sensitive material,
    forming and patterning another layer of photoresist on said layer of acid sensitive material using another lithographic pitch split exposure mask,
    applying an acidic overcoat on said another patterned layer of photoresist and areas of said acid sensitive material exposed by said photoresist,
    activating said areas of said acid sensitive material, and
    developing activated areas of said acid sensitive material.

12. The method as recited in claim 11, comprising the further step of
    transferring a pattern developed in said acid sensitive material to an underlying layer of material.

13. The method as recited in claim 11, wherein said acid sensitive material is formed on an organic planarizing layer.

14. The method as recited in claim 11, further including a step of
    adjusting size of a feature patterned in said resist.

15. The method as recited in claim 11, further including a step of
    adjusting size of a feature patterned in said acid sensitive material.

* * * * *